United States Patent
Korodi et al.

(10) Patent No.: US 8,378,862 B2
(45) Date of Patent: Feb. 19, 2013

(54) METHOD AND DEVICE FOR COMPRESSION OF BINARY SEQUENCES BY GROUPING MULTIPLE SYMBOLS

(75) Inventors: Gergely Ferenc Korodi, Waterloo (CA); Dake He, Waterloo (CA)

(73) Assignee: Reserch In Motion Limited, Waterloo, Ontario (CA)

( * ) Notice: Subject to any disclaimer, the term of this patent is extended or adjusted under 35 U.S.C. 154(b) by 77 days.

(21) Appl. No.: 13/193,125

(22) Filed: Jul. 28, 2011

(65) Prior Publication Data

US 2012/0026020 A1  Feb. 2, 2012

Related U.S. Application Data

(60) Provisional application No. 61/368,474, filed on Jul. 28, 2010.

(51) Int. Cl.
*H03M 7/30* (2006.01)

(52) U.S. Cl. .......................................... 341/107; 341/50

(58) Field of Classification Search .................... 341/50, 341/51, 67, 107; 382/244–247; 375/240–240.26
See application file for complete search history.

(56) References Cited

U.S. PATENT DOCUMENTS

| | | | |
|---|---|---|---|
| 5,148,272 A | | 9/1992 | Acampora |
| 5,381,145 A | | 1/1995 | Allen |
| 5,694,128 A | * | 12/1997 | Kim .............................. 341/107 |
| 5,717,394 A | | 2/1998 | Schwartz |
| 5,912,636 A | * | 6/1999 | Gormish et al. ................. 341/50 |
| 6,661,839 B1 | | 12/2003 | Ishida |
| 7,518,537 B2 | * | 4/2009 | Sekiguchi et al. ............ 341/107 |
| 7,545,293 B2 | | 6/2009 | Reznik |
| 7,573,407 B2 | | 8/2009 | Reznik |
| 2006/0158355 A1 | | 7/2006 | Jeon |
| 2007/0150497 A1 | | 6/2007 | De La Cruz |
| 2008/0243205 A1 | | 10/2008 | Corndorf |
| 2009/0279613 A1 | | 11/2009 | Suzumura |

FOREIGN PATENT DOCUMENTS

| | | |
|---|---|---|
| CA | 2138324 | 12/1995 |
| CA | 2676099 | 8/2002 |
| GB | 2285374 | 7/1995 |
| GB | 2319689 | 5/1998 |
| JP | 8065171 | 3/1996 |
| WO | 2007066121 | 6/2007 |
| WO | 2008053755 | 5/2008 |
| WO | 2009005758 | 1/2009 |
| WO | 2009157043 | 12/2009 |
| WO | 2010091505 | 8/2010 |

OTHER PUBLICATIONS

International Search Report dated Apr. 19, 2011, Application No. PCT/CA2011/050034.

(Continued)

*Primary Examiner* — Howard Williams
(74) *Attorney, Agent, or Firm* — Rowand LLP

(57) ABSTRACT

A method for encoding an input sequence of symbols to produce a bitstream and a method of decoding the bitstream to generate a reconstructed binary sequence. Encoding employs $2^L$-ary encoding trees having codewords associated with leaf nodes. A context model is used to select an encoding tree corresponding to an estimated probability at the encoder. The same context model is used by the decoder to select a decoding tree. The decoder interleaves bits from decoded sequences of length-L strings associated with different estimated probabilities, based on the context model.

18 Claims, 8 Drawing Sheets

OTHER PUBLICATIONS

Boliek M et al: "Very high speed entropy coding" Proceedings of the International Conference on Image Processing (ICIP) Austin, Nov. 13-16, 1994; [Proceedings of the International Conference on Image Processing (ICIP)] Los Alamitos, IEEE Comp. Soc. Press, US LNKD DOI:10.1109/ICIP.1994.413814, vol. 3, Nov. 13, 1994, pp. 625-629, XP010146390.

Mastronarde N H et al: "A Bargaining Theoretic Approach to Quality-Fair System Resource Allocation for Multiple Decoding Tasks" IEEE Transactions on Circuits and Systems for Video Technology, IEEE Service Center, Piscataway, NJ, US, vol. 18, No. 4, Apr. 1, 2008, pp. 453-466, XP011204010.

European Search Report dated Aug. 12, 2010, EP 10 15 97.

Extended European Search Report dated Jul. 2, 2010, EP 10 15 4032.

Vivienne Sze, Anantha P. Chandrakasan, Madhukar Budagavi, Minhua Zhou: Parallel CABAC for low power video coding. ICIP 2008: 2096-2099. Available under http://www-video.eecs.berkeley.edu/Proceedings/ICIP2008/pdfs/0002096.pdf.

Chung-Hyo Kim and In-Cheol Park, "Parallel Decoding of Context-based Adaptive Binary Arithmetic Codes Based on Most Probable Symbol Prediction", IEICE Trans. Inf. & Syst., vol. E90?D, No. 2 Feb. 2007. p. 609. Available under http://ics.kaist.ac.kr/ver3.0/intjpapers/Parallel%20Decoding%20of%20Context-based%20Adaptive%20Binary%20Arithmetic%20Codes%20Based%20on%20Most%20Probable%20Symbol%20Prediction.pdf.

International Search Report and Written Opinion, dated Apr. 19, 2011, PCT/CA2011/050034.

G.H. Freeman, "Divergence and the construction of variable-to-variable length lossless codes by source word extensions," Proc. Data Compression Conference, IEEE Computer Society Press, 1993, pp. 79-88.

W.B. Pennebaker, J.L. Mitchell, G.G. Langdon, Jr., R.B. Arps, "An overview of the basic principles of the Q-Coder adaptive binary arithmetic coder," IBM Journal of Research and Development, v.32 n.6, p. 717-726, Nov. 1998.

International Search Report dated Oct. 24, 2011, PCT/CA2011/050466.

Joshua Senecal, Mark Duchaineau and Kenneth I. Joy, "Length-Limited Variable-to-Variable Length Codes for High-Performance Entropy Coding," Proc. Data Compression Conference 2004, p. 389.

P.R. Stubley, "Adaptive variable-to-variable length codes," in Proc. Data Compression Conference 1994, pp. 98-105.

Freking R A et al: An unrestrictedly parallel scheme for ultra-high-rate reprogrammable Huffman coding ICASSP—, IEEE International Conference on Acoustics, Speech and Signal Processing—Proceedings 1999 IEEE, vol. 4, Mar. 15, 1999, pp. 1937-1940, XP010327787.

(Weiss et al.) 1st named author, Shay-Beren et al: "Class-based decompressor design for compressed instruction memory in embedded processors" IEEE Transactions on Computers, IEEE Service Center, Los Alamitos, CA, US LNKD D01:10.1109/TC.2003.1244947, vol. 52, No. 11, Nov. 1, 2003, pp. 1495-1500, XP011103299.

Marpe D et al: "Context-based adaptive binary arithmetic coding in the H.264/AVC video compression standard" IEEE Transactions on Circuits and Systems for Video Technology, IEEE Service Center, Piscataway, NJ, US LNKD DOI:101109/TCSVT.2003.815173, vol. 13, No. 7, Jul. 1, 2003, pp. 620-636, XP011099255.

Franaszek P et al: "Parallel compression with cooperative dictionary construction" Data Compression Conference, 1996 DCC '96 Proceedings Snowbird; UT USA Mar. 31-Apr. 3 1996, Los Alamitos CA, USA, IEEE Comput. Soc, US LNKD-D01:10.1109/DCC.1996.488325, pp. 200-209, XP010156561.

Dake et al., Improving throughput for V2V coding in HEVC, Input Document by Research in Motion Ltd. to joint Collaborative Team on Video Coding (JCT-VC), Geneva, Jul. 21-28, 2010.

Budagavi et al., Parallel Context Processing techniques for high coding efficiency entropy coding in HEVC, Input Document by Texas Instruments Inc. to Joint Collaborative Team on Video Coding (JCT-VC), Geneva, Jul. 21-28, 2010.

International Search Report dated Jul. 8, 2011, PCT/CA2011/050208.

Extended European Search Report dated Aug. 23, 2010, EP 10 15 4962.

* cited by examiner

METHOD AND DEVICE FOR COMPRESSION OF BINARY SEQUENCES BY GROUPING MULTIPLE SYMBOLS

CROSS REFERENCE TO RELATED APPLICATIONS

The present application claims priority to, and incorporates by references, U.S. provisional patent application Ser. No. 61/368,474, filed Jul. 28, 2010 and owned in common herewith.

FIELD

The present application generally relates to data compression and, in particular, to an encoder, a decoder and methods of entropy coding and entropy decoding.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, baseline profile and others.

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding.

It would be advantageous to provide for an improved encoder, decoder and method of entropy coding and decoding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
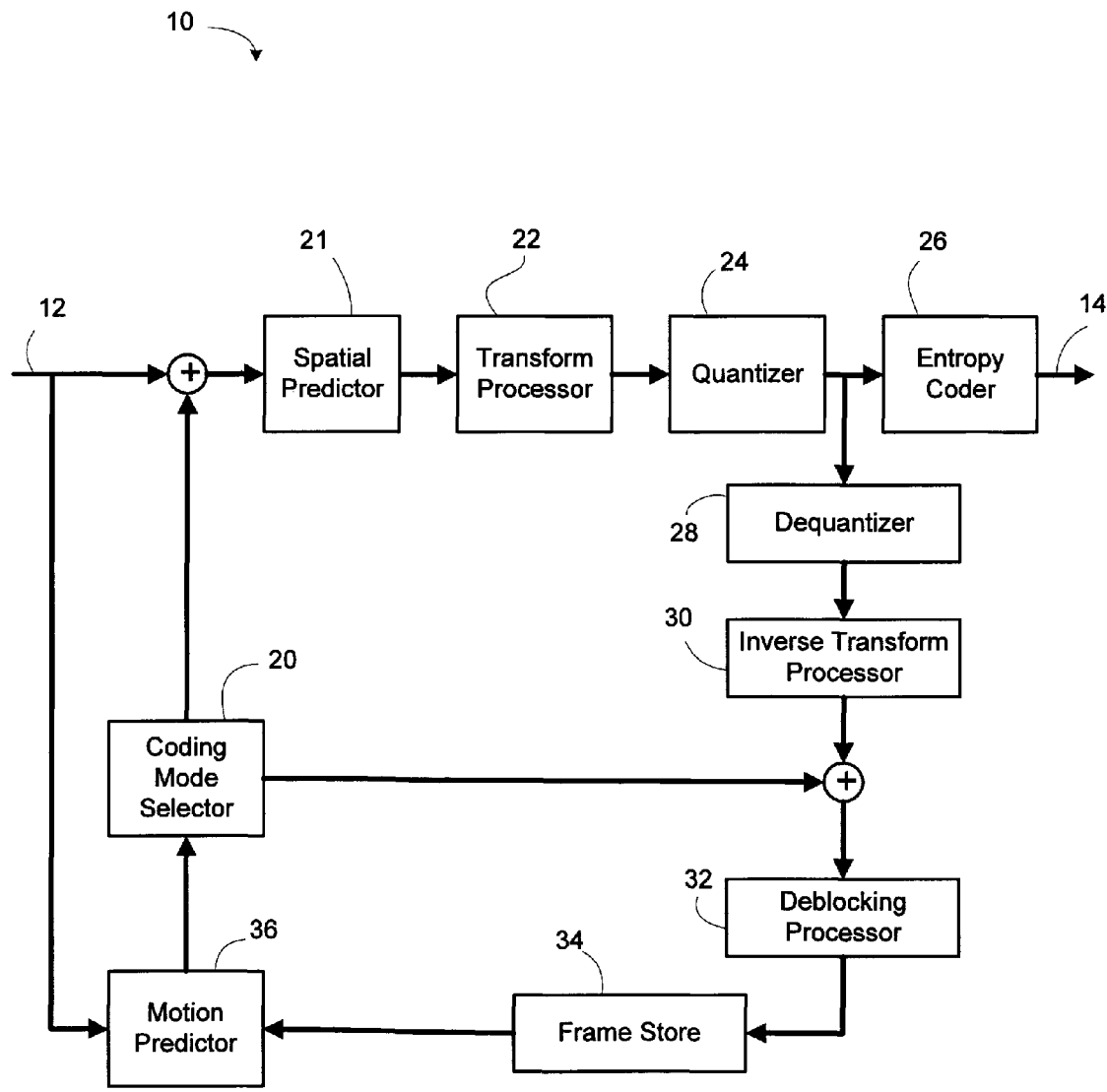
FIG. 1 shows, in block diagram form, an encoder for encoding video.

The present application describes devices, methods and processes for encoding and decoding data.

In one aspect, the present application describes a method for encoding an input sequence of binary symbols. The method includes grouping binary symbols in the said input sequence into consecutive binary strings of length L (L>1) according to a context model; selecting an $2^L$-ary encoding tree for each said length L string based on a context statedetermined from the said context model; and traversing the encoding tree based on the length L binary strings until a leaf node is reached at which point the corresponding codeword is output.

In another aspect, the present application describes a method for decoding a bitstream of encoded data to generate a reconstructed binary sequence, the bitstream containing a plurality of codewords. The method includes determining a context state associated with a next bit of the reconstructed binary sequence based on a context model; and determining whether a length L (L>1) string associated with that context state is available from a bit sequence obtained from a previously decoded codeword and, if so, adding that string to the reconstructed binary sequence. If no such string are available then parsing the bitstream to extract a next codeword, decoding the next codeword to obtain a new bit sequence associated with that context state, and adding a length L string from the new bit sequence to the reconstructed binary sequence.

In another aspect, the present application describes a method for encoding an input sequence of symbols. The method includes, grouping symbols in the input sequence into length L strings based on a context model, wherein each length L string contains symbols that have a common context; and sequentially, for each length L string, determining an estimated probability for a first symbol in that string based on the said context model, identifying a codeword associated with a sequence of strings resulting from appending that string to a previous sequence of strings associated with that estimated probability, using an encoding tree associated with that estimated probability, and storing the codeword in a buffer element of a first-in-first-out buffer, wherein the buffer element is associated with the estimated probability; and outputting stored codewords from the buffer in a first-in-first-out order.

In another aspect, the present application describes a method for encoding an input sequence of symbols. The method includes: i) sequentially, for each symbol not yet processed in the input sequence: a) determining a context and an estimated probability for that symbol based on a context model, b) forming a length L string by concatenating L−1 remaining symbols in the input sequence to the symbol based on the context model, c) identifying a codeword associated with a sequence of strings resulting from appending that length-L string to a previous sequence of length-L strings associated with that estimated probability, using an $2^L$-ary encoding tree associated with that estimated probability, marking all the symbols in that length-L string processed, and d) storing the codeword in a buffer element of a first-in-first-out buffer, wherein the buffer element is associated with the context; and ii) outputting stored codewords from the buffer in a first-in-first-out order.

In another aspect, the present application describes an encoder for encoding an input sequence of symbols. The encoder includes a processor and a memory. The encoder also includes a first-in-first-out buffer and an encoding application stored in memory and containing instructions for configuring the processor to encode the input sequence by: i) sequentially, for each symbol not yet processed in the input sequence: a) determining a context and an estimated probability for that symbol based on a context model, b) forming a length L string by concatenating a fixed number of remaining symbols in the input sequence to the symbol based on the context model, c) identifying a codeword associated with a sequence of strings resulting from appending that length-L string to a previous sequence of length-L strings associated with that estimated probability, using an $2^L$-ary encoding tree associated with that estimated probability, marking all the symbols in that length-L string processed, and d) storing the codeword in a buffer element of a first-in-first-out buffer, wherein the buffer element is associated with the context; and ii) outputting stored codewords from the buffer in a first-in-first-out order.

In yet another aspect, the present application describes a method for encoding an input sequence of symbols using a context model having a set of probabilities and a respective $2^L$-ary encoding tree associated with each context. The method includes, for each group of L consecutive symbols in the input sequence, determining a context state associated with that group based on a first symbol of the group of L consecutive symbols, the first symbol having an estimated probability, and updating the context state and the estimated probability based on the symbols in the group and the context model; and encoding sequences of the groups of L consecutive symbols having the same context state using the $2^L$-ary encoding tree associated with that context state, wherein each sequence is encoded as a codeword.

In another aspect, the present application describes a method for encoding an input sequence of binary symbols using a context model having a set of context states and a respective $2^L$-ary encoding tree associated with each context state. The method includes, for a length-L string of consecutive symbols, determining the context state for a first symbol of the length-L string, and selecting the $2^L$-ary encoding tree associated with that context state. The method then includes appending subsequent length-L strings of consecutive symbols to the length-L string of consecutive symbols to form a sequence of strings and encoding that sequence of strings as a codeword using the selected $2^L$-ary encoding tree; and updating the context state based on the symbols in that sequence of strings and the context model.

In a further aspect, the present application provides a method for encoding an input sequence of symbols using a context model having a set of probabilities and a respective $2^L$-ary encoding tree associated with each probability. The method includes, for each group of L consecutive symbols in the input sequence, determining a context state and an estimated probability for a first symbol of the group of L consecutive symbols, updating the context state and the estimated probability based on the symbols in the group and the context model; and encoding sequences of the groups of L consecutive symbols having the same estimated probability using the $2^L$-ary encoding tree associated with that estimated probability, wherein the each sequence is encoded as a codeword.

In another aspect, the present application describes a method for decoding a bitstream of encoded data to generate a reconstructed binary sequence, the bitstream containing a plurality of codewords. The method includes determining an estimated probability associated with a next bit of the reconstructed binary sequence based on a context model; and determining whether a length-L string whose leading bit is associated with that estimated probability is available from a bit sequence obtained from a previously decoded codeword and, if so, adding that length-L string to the reconstructed binary sequence. If the length-L string having a leading bit associated with that estimated probability is not available from a previously decoded bit sequence, then the method includes parsing the bitstream to extract a next codeword, decoding the next codeword to obtain a new bit sequence associated with that estimated probability, and adding a first length-L string from the new bit sequence to the reconstructed binary sequence.

In yet a further aspect, the present application describes a method for decoding a bitstream of encoded data to generate a reconstructed binary sequence, the bitstream containing a plurality of codewords. The method includes determining a context associated with a next bit of the reconstructed binary sequence based on a context model; and determining whether a decoded bit associated with that context is available from a previously decoded codeword and, if so, adding that decoded bit to the reconstructed binary sequence, and, if not then parsing the bitstream to extract a next codeword, decoding the next codeword using a decoding table selected based upon a context state to obtain a new bit sequence associated with that context, and adding a first decoded bit from the new bit sequence to the reconstructed binary sequence.

In further aspects, the present application describes encoders for implementing the above methods. The encoders include memory, a processor, and an encoding application stored in memory and having computer-executable instructions for configuring the processor to perform the operations of the methods described herein.

In further aspects, the present application describes decoders for implementing the above methods. The decoders include memory, a processor, and a decoding application stored in memory and having computer-executable instructions for configuring the processor to perform the operations of the methods described herein.

The present application further describes computer-readable media having encoded thereon computer-executable instructions for configuring a processor to implement one or more of the methods described herein.

Other aspects and features of the present application will be understood by those of ordinary skill in the art from a review of the following description of examples in conjunction with the accompanying figures.

The following description relates to data compression in general and, in particular, to the efficient encoding of finite alphabet sources, such as a binary source. In many of the examples given below, particular applications of such an encoding and decoding scheme are given. For example, many of the illustrations below make reference to video coding. It will be appreciated that the present application is not limited to video coding or image coding.

In the description that follows, example embodiments are described with reference to the ITU-T Rec. H.264|ISO/IEC 14496-10 (hereafter "H.264") standard. Those ordinarily skilled in the art will understand that the present application is not limited to H.264 but may be applicable to other video coding/decoding standards. It will also be appreciated that the present application is not necessarily limited to video coding/decoding and may be applicable to coding/decoding of any binary sources.

In the description that follows, in the context of video applications the terms frame, slice and picture are used somewhat interchangeably. Those of skill in the art will appreciate that, in the case of the H.264 standard, a frame may contain one or more slices or tiles, and a slice or tiles may contain one or more coding units that could be called macroblocks. It will also be appreciated that certain encoding/decoding operations are performed on a frame-by-frame basis, some are performed on a slice-by-slice basis, and some are performed on a coding unit-by-coding unit basis, depending on the particular requirements of the applicable video coding standard. In any particular embodiment, the applicable video coding standard may determine whether the operations described below are performed in connection with frames and/or slices and/or coding units, as the case may be. Accordingly, those ordinarily skilled in the art will understand, in light of the present disclosure, whether particular operations or processes described herein and particular references to frames, slices, picture or both are applicable to frames, slices, picture or both for a given embodiment.

Figure 2:
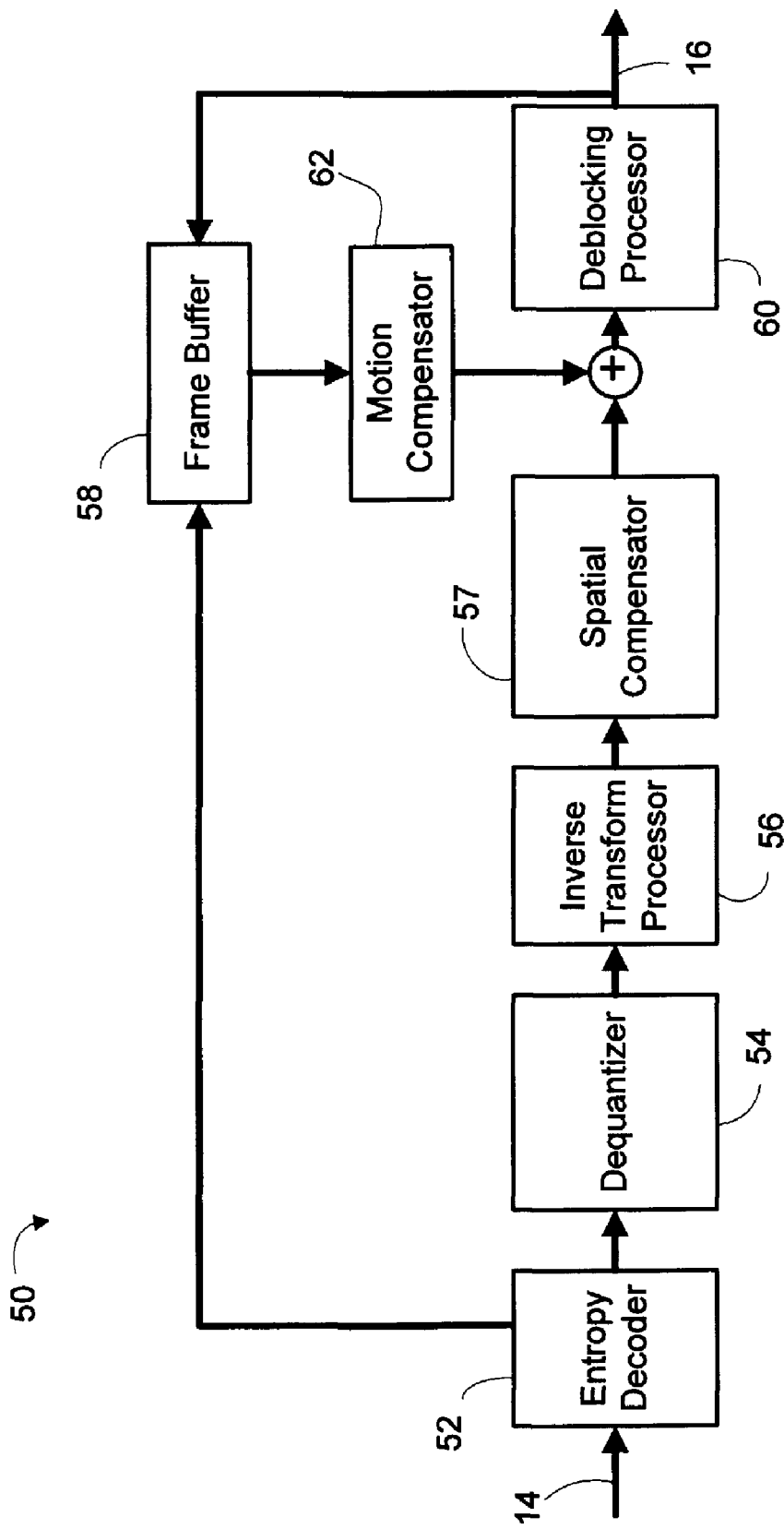
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices/pictures (i.e. type I) are encoded without reference to other frames/slices/pictures. In other words, they do not employ temporal prediction. However intra-coded frames/pictures do rely upon spatial prediction within the frame/slice/picture, as illustrated in FIG. 1 by the spatial predictor 21. That is, when encoding a particular block/coding unit the data in the block/coding unit may be compared to the data of nearby pixels within blocks/coding units already encoded for that frame/slice/pictures. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements minor the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

In some important practical applications, such as high-quality video decoding, the entropy decoder has to reach very high output speed, which can pose a problem for devices with limited processing power or speed. For many such devices CABAC is too computationally demanding.

One of the techniques used in some entropy coding schemes, such as CAVLC and CABAC, both of which are used in H.264, is context modeling. With context modeling, each bit of the input sequence has a context, where the context is given by the bits that preceded it. In a first-order context model, the context may depend entirely upon the previous bit (symbol). In many cases, the context models may be adaptive, such that the probabilities associated with symbols for a given context may change as further bits of the sequence are processed.

Figure 3:
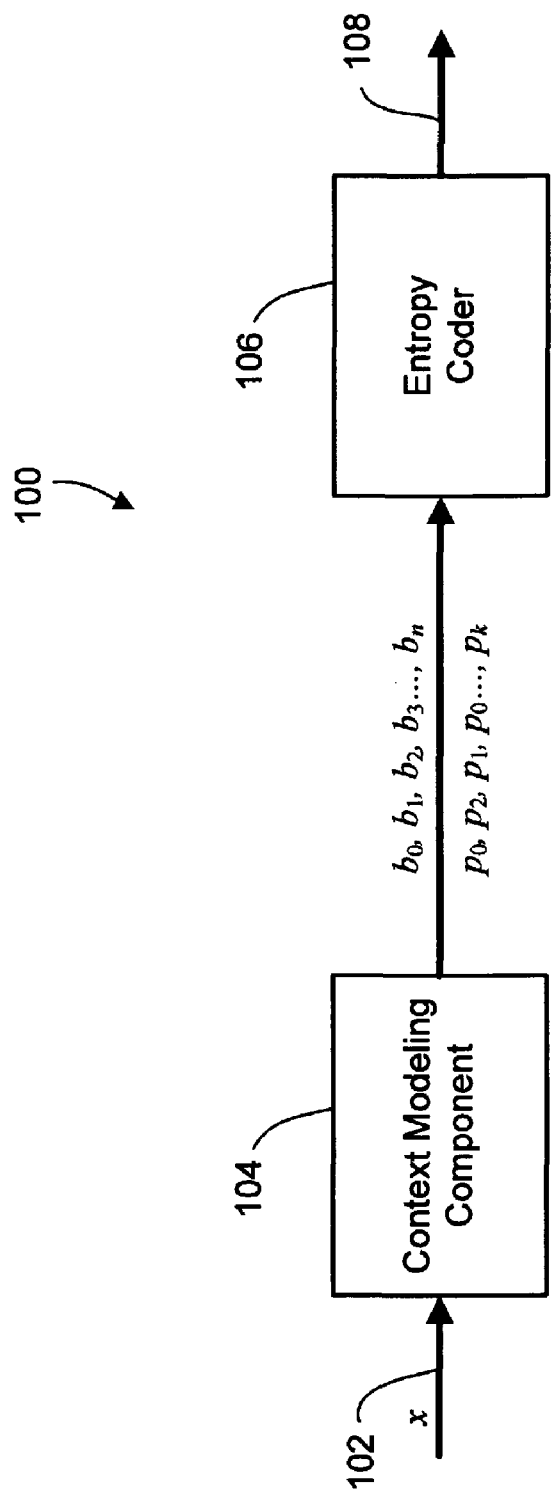
FIG. 3 shows a block diagram of an encoding process.

Reference is made to FIG. 3, which shows a block diagram of a conventional encoding process 100. The encoding process 100 includes a context modeling component 104 and an entropy coder 108. The context modeling component 104 receives the input sequence x 102, which in this example is a bit sequence ($b_0, b_1, \ldots, b_n$). The context modeling component 104 determines a context for each bit $b_i$ based on one or more previous bits in the sequence, and determines, based on the adaptive context model, a probability $p_i$ associated with that bit $b_i$. This is the probability that the bit is a particular symbol; in a binary alphabet $p_i$ is typically the probability that the bit is a least probable symbol. The context modeling component outputs the input sequence, i.e. the bits ($b_0, b_1, \ldots, b_n$) along with their respective probabilities ($p_0, p_1, \ldots, p_n$). The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data. Those skilled in the art will appreciate that in many implementations the context modeling component 104 may receive higher order data, such as the coefficients and motion vectors, etc., from which it generates the input sequence of bits and their respective probabilities.

In the description that follows, reference may be made to embodiments for entropy encoding a binary sequence. It will be understood that the described processes may be generalized to symbols of a finite alphabet and that a binary sequence is a special case. Suitable modifications to some aspects of the following description to incorporate more than two symbols will be appreciated by those ordinarily skilled in the art.

Codeword Generation

The present application, in one aspect, describes an entropy coding and decoding process that employs encoding trees for resolving codewords. Leaves of the trees are each associated with a codeword from a codeword set. Generation of the encoding trees and codewords may be performed offline. An example embodiment of codeset generation is described in U.S. Pat. No. 7,990,297, granted Aug. 2, 2011, and owned in common herewith, the contents of which is hereby incorporated by reference.

The input sequence can be understood as being n input sources interleaved arbitrarily, where each of the n sources is associated with a context.

Consider a finite set of probabilities P={$p_k | 1 \leq k \leq n$, $0 < p_k \leq 0.5$}. The $p_k$ values are regarded as probability values for the Least Probable Symbol (LPS); their complements are of the form $1-p_k$, and they belong to the Most Probable Symbol (MPS). In practice, the selection of $p_k$ (or equivalently the index k) to encode the next bit is determined from the context, which itself is determined from the encoded history. In context-adaptive encoding the probability $p_k$ depends on the current state of the input sequence. The number of probabilities, n, may be set depending on a number of factors, including desired complexity. In H.264 CABAC, for example, the number n is 64.

In the case of H.264 CABAC, a finite state machine may be used to track the context state and the consequent probability. An example implementation may use a set of arrays to specify state changes and to determine MPS/LPS changes. By convention, the LPS=1, but in some circumstances it may change to LPS=0; this change can occur bit-by-bit, so an array may be used to specify in which cases it changes.

As an example, for each k, $1 \leq k \leq n$, the following four arrays are defined:
1. $T_{MPS}[k]$: The state to go to after encountering an MPS in state k.
2. $T_{LPS}[k]$: The state to go to after encountering an LPS in state k.
3. $C_{MPS}[k]$: Indicates if there is to be a change in the value of MPS, after encountering an MPS in state k.

4. $C_{LPS}[k]$: Indicates if there is to be a change in the value of MPS, after encountering an LPS in state k.

An example in H.264 CABAC is given below to illustrate these arrays.

P={$0.5*0.949217148771^{k-1}$; $1 \leq k \leq n$};

$T_{MPS}$={1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 62, 63};

$T_{LPS}$={0, 0, 1, 2, 2, 4, 4, 5, 6, 7, 8, 9, 9, 11, 11, 12, 13, 13, 15, 15, 16, 16, 18, 18, 19, 19, 21, 21, 22, 22, 23, 24, 24, 25, 26, 26, 27, 27, 28, 29, 29, 30, 30, 30, 31, 32, 32, 33, 33, 33, 34, 34, 35, 35, 35, 36, 36, 36, 37, 37, 37, 38, 38, 63};

$C_{MPS}[k]$=0 for all $1 \leq k \leq n$, $C_{LPS}[k]$=1 for k=1, and 0 for $1 < k \leq n$.

In one aspect, the present application provides a technique and process for improving throughput and speed at the encoder and decoder by processing multiple symbols (e.g. bits) from an input sequence as a group. It will be understood that the context state and probability change from bit-to-bit. The fact that the probability is constantly evolving and changing makes it counterintuitive to attempt processing of more than a single bit at a time. Nonetheless, the changes occur on the basis of a fixed context model, and those rule-based changes can be incorporated into design and implementation of the codeset.

To lay down a mathematical framework, consider any integer value v, and let bit(v, i)=(v>>i) & 1 denote the $i^{th}$ bit of v. Note that the convention MPS=0 and LPS=1 is used. For any state k, let state(v, −1, k)=k and state(v, i, k)=$T_{bit(v, i)}$[state(v, i−1, k)]. For any state k, let change(v, −1, k)=0 and change(v, i, k)=($C_{bit(v, i)}$[state(v, i−1, k)]+change(v, i−1, k)) mod 2. Finally, let cbit(v, i, k)=bit(v, i)^change(v, i−1, k). In this notation, the state ( ) function applies the state changes beginning from state k for each of the bits of v in turn, and i is an index to the bits in v. The change( ) function specifies whether MPS/LPS changes at each bit in v. It will be appreciated that C-notations are used throughout the present description.

To first identify the L-length strings, for each state k and integer L>1, the following arrays may be generated:

1. $MV_L$: The symbols that are formed by all L-bit long binary strings. In other words, these symbols correspond to the indices ranging from 0 to $2^L-1$.
2. $MP_L$: The symbol probabilities: $MP_L(v, k)=\Pi_{i=0, \ldots, L-1}$ (cbit(v, i, k)==LPS? $P_{state(v, i-1, k)}$: $1-P_{state(v, i-1, k)}$), for each v in $MV_L$.
3. $MS_L$: The state transitions: $MS_L(v, k)$=state(v, L, k), for each v in $MV_n$
4. $MC_L$: The MPS transitions: $MC_L(v, k)=(\Sigma_{i=0, \ldots, L-1} C_{bit(v, i)}$[state(v, i−1, k)]) mod 2, for each v in $MV_L$.

In one example implementation, the encoder and decoder are configured to use a codeset constructed to encode sequences of length m*L, where L>1 is a fixed integer and m>0 is a variable integer. The codeword set constructions is guided by the construction of a $2^L$-ary tree. Initially, this tree has no edges and only a single node, which is regarded as a leaf, and it corresponds to the empty sequence (no symbols) with probability 1. This root node is also associated to the initial state $k_0$ and LPS=1. In each step, a particular leaf, corresponding to the symbol sequence V, probability P, state k and LPS s, is selected, and it is made an internal node with $2^L$ children, each of them leaves, which correspond to the sequences V|$MV_L$[0], V|$MV_L$[1], V|$MV_L$[$2^L$−1] (the symbol | denotes string concatenation), with probabilities P*$MP_L$(0,k), P*$MP_L$(1,k), . . . , P*$MP_L$($2^L$−1,k), states $MS_L$(0,k), $MS_L$(1,k), . . . , $MS_L$($2^L$−1,k), and LPS values (s+$MC_L$(0,k)) mod 2, (s+$MC_L$(1,k)) mod 2, . . . , (s+$MC_L$($2^L$−1,k)) mod 2. This step is then repeated until a certain terminating condition is satisfied. In one example implementation, this condition may be a threshold to the number of leaves in the tree. Once the tree construction is complete, the codeword set may be assigned to the sequences corresponding to the leaves, based on the probabilities associated to the leaves. In one example implementation, this codeword set may be generated using the Huffman-algorithm.

The tree generation process for each $p_k$ of P, symbols (or length-L strings represented by the symbols) are combined into a set of sequences $S_k$ subject to certain constraints. Example constraints may include:

1. No sequence probability is lower than a threshold value.
2. The number of sequences is smaller than a limit value.
3. An efficient codeword set exists for $S_k$.
4. The set of sequences $S_k$ are capable of a convenient or efficient representation in the structure of the given embodiment.

Various algorithms may be employed to balance relevant constraints in generating suitable binary trees and respective codewords.

In one embodiment, the $2^L$-ary tree generation process may result in a Huffman code set. As will be explained further below, under certain circumstances an input sequence may terminate before completing a sequence of $S_k$, and thus a mechanism may be used to encode the prefix (the partially complete sequence of $S_k$). The use of secondary codewords to encode sequences that terminate at internal nodes of an encoding tree is described in U.S. Pat. No. 7,990,297, owned in common herewith. It will be understood that the use of a secondary codeset is not a requirement in some embodiments of the present application, and that flush events and incomplete sequences may be encoded using other techniques. In fact, because each node transition is based upon multiple symbols (L symbols), a sequence that terminates at an internal node may have additional fewer-than-L symbols that need to be encoded using another mechanism. Accordingly, secondary codewords, as described in U.S. Pat. No. 7,990,297, are not a complete answer to this issue in this situation; an alternative mechanism for dealing with "flush events" may be advantageous. For example, as described below, dummy symbols may be appended to complete a codeword. The context model can be relied upon to know how many symbols to process in each context.

The resulting code sets are variable-to-variable length code sets.

The code sets are written in two forms: one specifying the encoder tree, the other the decoder tree, for state k. The encoder tree maps the parsed sequences defined by the paths, which consist of length L strings, to the Huffman codewords which are defined by $Q_k$. The decoder tree is its inverse, mapping the Huffman codewords to the original paths consisting of length L strings.

In a variant to the above process, the codesets are constructed slightly differently. The encoder and decoder are configured, as above, to use a codeword set constructed to encode sequences of length m*L, where L>1 is a fixed integer and m>0 is a variable integer. The tree is associated to the state $k_0$ and LPS=1. In each step, a particular leaf, corresponding to the symbol sequence V, probability P, is selected, and it is made an internal node with $2^L$ children, each of them leaves, which correspond to the sequences V|$MV_L$[0], V|$MV_L$[1], . . . , V|$MV_L$[$2^L$−1] (the symbol | denotes string concatenation), with probabilities P*$MP_L$(0,$k_0$), P*$MP_L$(1,$k_0$), . . . , P*$MP_L$($2^L$−1, $k_0$). This step is then repeated until a certain terminating condition is satisfied. In one example implementation, this condition may be a threshold to the number of leaves in the tree. Once the tree construction is complete, the codeword set may be assigned to the sequences corresponding to the leaves, based on the probabilities associated to the leaves. In one example implementation, this codeword set may be generated using the Huffman-algorithm.

In this implementation, the coding buffer is associated to coding trees. When a context in state k and LPS=s receives the L-long sequence j, it encodes j (if s==1) or ~j (if s==0) using the tree associated to k, then the context transfers to state $MS_L(j,k)$, and LPS value $(s+MC_L(j,k))$ mod 2.

Encoding Process

As described above, in some embodiments the encoder includes a codeset for each context state k. The codewords for each of the codesets may be incorporated into an encoding table. The encoder, in such an embodiment, would have k encoding tables stored in memory to represent the k encoding trees and the codewords associated with each sequence $S_k$ in the trees.

In each step the input is a state k, and L binary digits b[0 . . . L−1]. During the encoding process, $2^L$-ary encoding trees are used. For each tree corresponding to state k, an active node is designated, which specifies what action needs to be taken:
1. If the active node is a root node, then a position is allocated in a code buffer, which is operated using a first-in-first-out policy.
2. If the active node is an internal node, then the next active node is decided by b. The encoder marks this node active, and returns the context state change given by state(b, L, k) and LPS change given by change(b, L, k) to the caller.
3. If the next active node is a leaf node, then the encoder moves its codeword defined by the Huffman code $HL_k$ to its position in the code buffer, and resets the next active node to the root note. Then, it returns the context state change given by state(b, L, k) and LPS change given by change(b, L, k) to the caller.
4. The caller uses state(b, L, k) and change(b, L, k) to update the context model for encoding the remaining input sequence.

Figure 4:
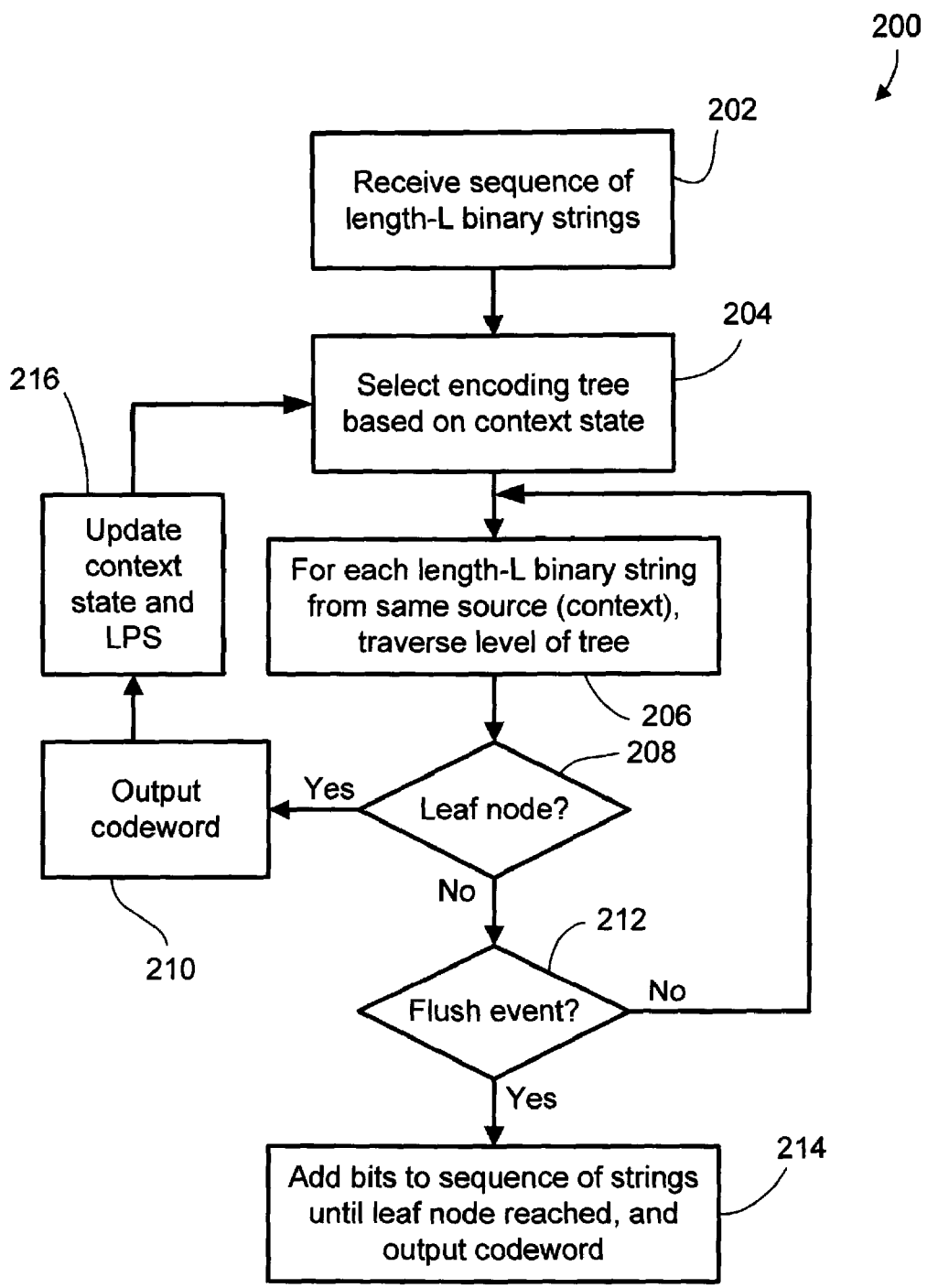
FIG. 4 shows an example method for encoding an input sequence.

Reference is now made to FIG. 4, which shows an example method 200 for encoding an input sequence. In this embodiment, the sequence is a binary sequence. In this example method 200, for simplicity of illustration, a single source sequence is assumed, i.e. a single context. Other embodiments dealing with interleaved sources are addressed further below.

The method 200 begins with receipt of the binary sequence in step 202 and selection of an encoding table or tree on the basis of the probability estimate $p_k$ associated with the binary sequence in step 204. As noted above, the method 200 is assumed to apply to a source sequence of length-L strings where the leading bit has a fixed probability estimate $p_k$.

Using the selected encoding tree, in step 206 the tree (or table in some implementations) is traversed using the sequence of length-L strings, where each symbol is an index between 0 and $2^L$−1. At each symbol, in step 208, the encoder assesses whether the sequence thus far results in a leaf node in the tree (or table). If so, then in step 210 a codeword is output. Then in step 216, the encoder updates the context state and LPS designation based upon the bits within the length-L strings. It then returns to select an encoding tree based on the updated context state and continues to process the binary sequence at step 206.

If the symbol (or the length-L string represented by that symbol) does not result in a completed codeword at step 208, then the encoder may assess whether a flush event occurs in step 212. Possible flush events are discussed further below; however, example flush events include the end of the input sequence or a buffer-full condition. If a flush event occurs while the encoder is at an internal node of the tree, then in step 214 dummy bits may be added to the incomplete sequence until a leaf node is reached. If no flush event occurs, the encoder returns to step 206 to continue symbol-by-symbol processing of the sequence of length-L strings.

As indicated above, for an input binary sequence x, the encoder evaluates an estimated probability value $p_i$ for the leading bit of a first length-L string. The estimated probability value $p_i$ is used to select the encoding tree associated with the estimated probability. Having selected the encoding tree based on the context state, all subsequent length-L strings for that context are appended so as to traverse the tree string-by-string until a leaf node (i.e. a codeword) is reached. The appended length-L strings form a sequence of strings that encoder encodes as a codeword once a leaf node is reached in the encoding tree. Strings associated with different contexts are encoded independently using their respective encoding trees and $HL_k$ codewords. The encoder generates a bitstream of encoded data containing the codewords.

The decoder receives the bitstream and extracts the codewords. Based on context, it identifies which state the codewords are each associated with and, on that basis, regenerates the sequence of length-L strings from the codeword. The regenerated strings of the various sequences are then interleaved by the decoder, using the same context model employed by the encoder.

It will be appreciated that in an interleaved sources embodiment, the codewords for various states are not necessarily resolved in the same order in which they are initially started. For example, when processing a bit sequence, the encoder may initially encounter strings associated with one context and start traversing an encoding tree associated with that context. However, before the encoding tree reaches a leaf, the input sequence may supply strings associated with another context. It is possible that the encoder will reach a leaf node and, thus, a codeword, for the source associated with the second context before it reaches a leaf node for the source associated with the first context. In order to ensure that the decoder is able to determine which codewords are associated with which states, the encoder ensures that the codewords are output in the order in which each was started, irrespective of which codeword was completed first.

In accordance with one aspect of the present application, the encoder ensures that codewords are output in the correct order by using a first-in-first-out buffer. The buffer may be a cyclic buffer.

Figure 5:
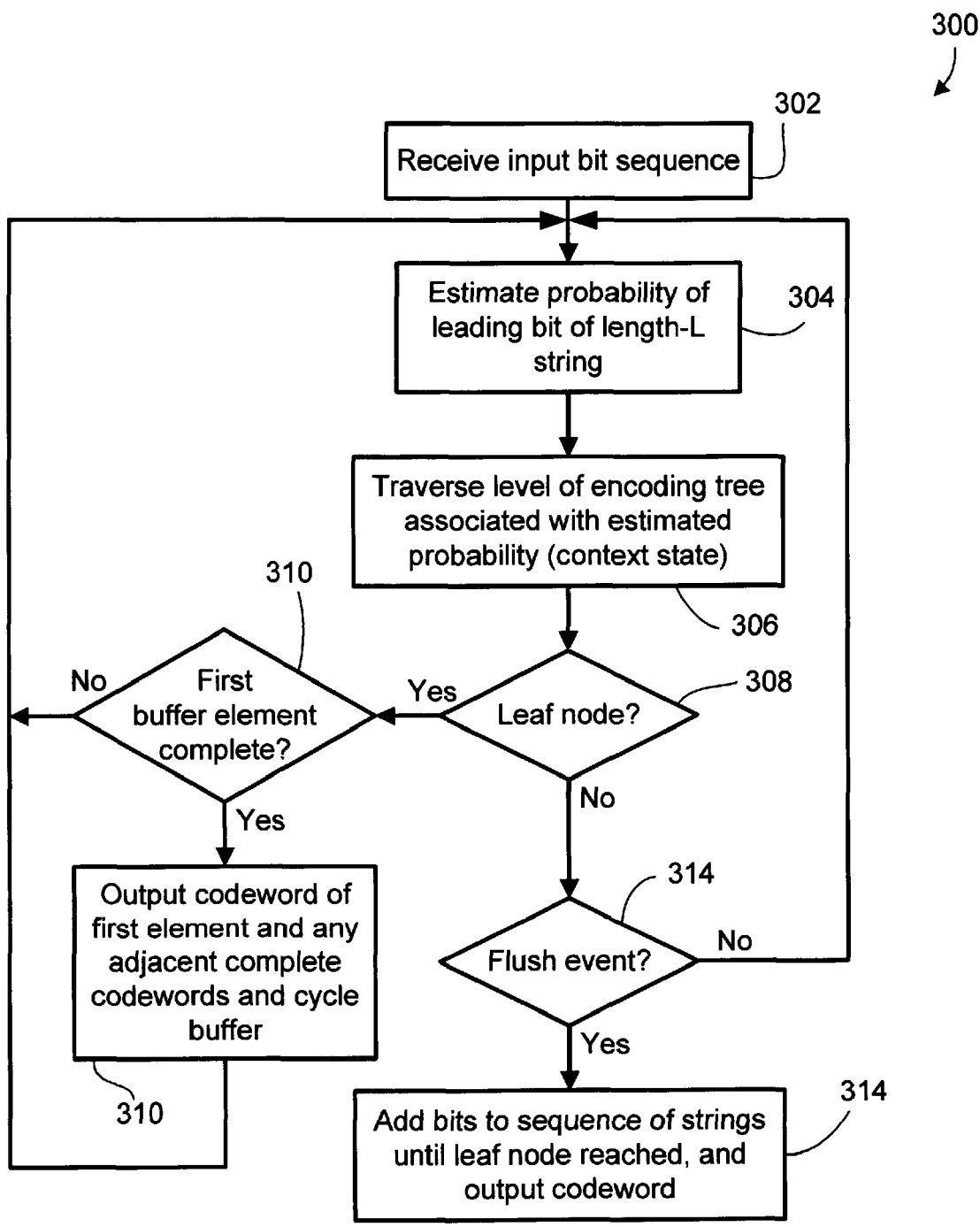
FIG. 5 shows, in flowchart form, another example method for encoding an input sequence.

Reference is now made to FIG. 5, which shows, in flowchart form, a method 300 for encoding an input sequence. In this example embodiment, the input sequence is assumed to be a binary sequence. The method 300 begins with receipt of the input sequence in step 302. For a length-L string extracted from the input sequence, the encoder uses context to determine an estimated probability $p_k$ associated with the leading bit in step 304. In many embodiments, the estimated probability $p_k$ is based upon a context model and one or more preceding bits in the sequence. The first bit in the sequence may be assigned a default estimated probability. The estimated probability (i.e. context state) determines the encoding tree used for encoding the sequence. In step 306, the length-L string is used to traverse a level of the encoding tree.

In step 308, the encoder determines whether the sequence to which the string was added at step 306 in now complete. In other words, whether the addition of the string has resulted in a leaf node. If so, then the corresponding codeword is added to a buffer element associated with the context.

If the sequence is complete (as determined at step 308), then at step 310, the encoder determines whether the first buffer element is complete 310. In at least some embodiments, this step 310 may include determining whether the first buffer element contains a codeword. If not, then the completed codeword for the context is retained in its position in the buffer and the encoder returns to step 304. If the L-length string just processed has resulted in completion of the codeword in the first buffer element, then in step 312, the encoder may output the codeword from the first buffer element and as many completed codewords as are present in the consecutively following buffer elements until it reaches a buffer element without a codeword.

If the length-L string does not result in a completed codeword in step 308, then the encoder determines whether a flush event has occurred at step 314. If not, then the encoder returns to step 306 to continue processing the next length-L string in the input sequence. If a flush event has occurred, then in step 316, the encoder flushes one or more buffer elements (in FIFO manner). The encoder may flush the elements by appending dummy bits, e.g. strings of MPS, until a leaf node is reached that results in a codeword.

Flush events are events in which it becomes necessary to output a codeword for an incomplete sequence $S_k$. One example flush event is the end of an input sequence. This may occur, for example, at the end of a video, a frame, a slice, a picture, a tile, or at other such breaks in the binary sequence. A flush event of this nature results in flushing the entire buffer so that the entire remainder of the encoded sequence is output in the bitstream.

Another example flush event is when the buffer becomes full. For example, if the first element of the buffer contains an incomplete codeword for state k, and the remainder of the buffer elements are allocated, if it becomes necessary to allocate an additional buffer element for a certain state before the codeword for the first element is complete, it may be necessary to flush the first element before it is complete. It will be understood that this type of flush event may only necessitate the flushing of the first element, and not necessarily the entire buffer.

Other example flush events will be appreciated by those ordinarily skilled in the art having regard to the present description.

In one variation to the example encoding processes described above, the encoder may update the context state and LPS after every length-L string, rather than waiting until after a complete sequence results in a codeword. In this variation, the updated context state is used to select an encoding tree for each length-L string. In other words, a completed codeword is based on a sequence made up of length-L strings from the same context (source), the leading bits of which have the same estimated probability (context state). It will be appreciated that this implementation involves more tree-switching than the processes described above.

Decoding Process

The decoder stores the code sets for each state k in decoder tree/table structures. For example, each state k may include a decoding tree for parsing codewords and regenerating the corresponding bit sequence. Each decoding tree for a state k may contain an integer for each node for parsing the codewords. Inner nodes may include an index to one or more child nodes. Leaf nodes may contain the sequence corresponding to the parsed codeword.

It will be appreciated that the decoder interleaves bits of the sequences of length-L strings decoded from the codewords based on context given by the context model.

Figure 6:
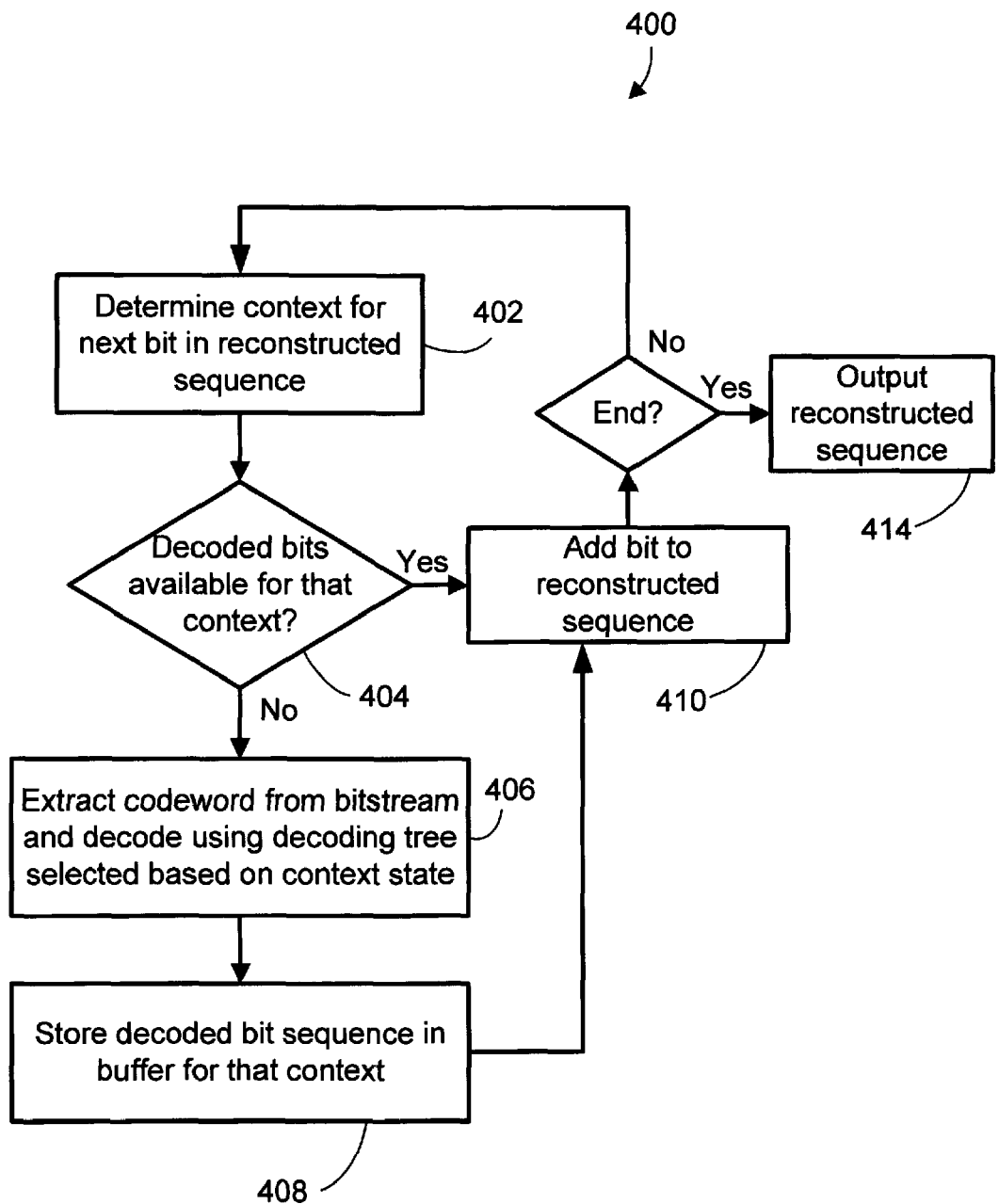
FIG. 6 shows, in flowchart form, an example method for entropy decoding a bitstream of encoded data.

Reference is now made to FIG. 6, which shows, in flowchart form, an example method 400 for entropy decoding a bitstream of encoded data. The method 400 employs the same context model used at the encoder for generating the bitstream of encoded data. The bitstream includes the codewords produced by the entropy coder at the encoder. The decoder generates the bit sequences corresponding to the codewords and interleaves the bits of the sequences of length-L strings in accordance with the context model. The method 400 results in output of a reconstructed binary sequence.

In particular, at step 402, the decoder determines a current context for the next bit in the reconstructed sequence.

The context is then used to determine the source from which the next bit is to come. In step 404, the decoder determines whether there are decoded bits available from that source (context). If not, then in step 406 the decoder parses the incoming bitstream to extract the next codeword. It decodes that next codeword using the decoder tree (or table) for the current context state (estimated probability). Decoding of the codeword produces the corresponding bit sequence. The bit sequence may be stored in a field or buffer associated with the context, as indicated by step 408. The first bit of that bit sequence is then added to the reconstructed binary sequence in step 410.

In step 412, the decoder may assess whether it has reached the end of the reconstructed binary sequence, which may occur when there are no further unconsumed bit sequences for any of the states and there are no further codewords in the bitstream. In that case, the method 400 ends with output of the binary sequence in step 414. Otherwise, it returns to step 402 to update the context. If the next bit having that context is available, as determined in step 404, then it proceeds immediately to step 410 to consume that bit (for example, from the field, register or buffer in which it is stored) and add it to the reconstructed binary sequence. If it is not available, either because that state has not been referenced previously or because the string last decoded for that state has been consumed, then the decoder parses the bitstream to identify the next codeword in step 406, and so on.

It will be appreciated that the decoder interleaves bits based upon context in this example process.

In one example embodiment, the process described above, in which encoding and decoding is done on the basis of L-length binary strings, is used for the encoding and decoding of a subset of the contexts. For example, it may be used with the twenty most common contexts. The remaining contexts may be encoded using other techniques, such as the technique described in U.S. Pat. No. 7,990,297.

Encoder and Decoder

Figure 7:
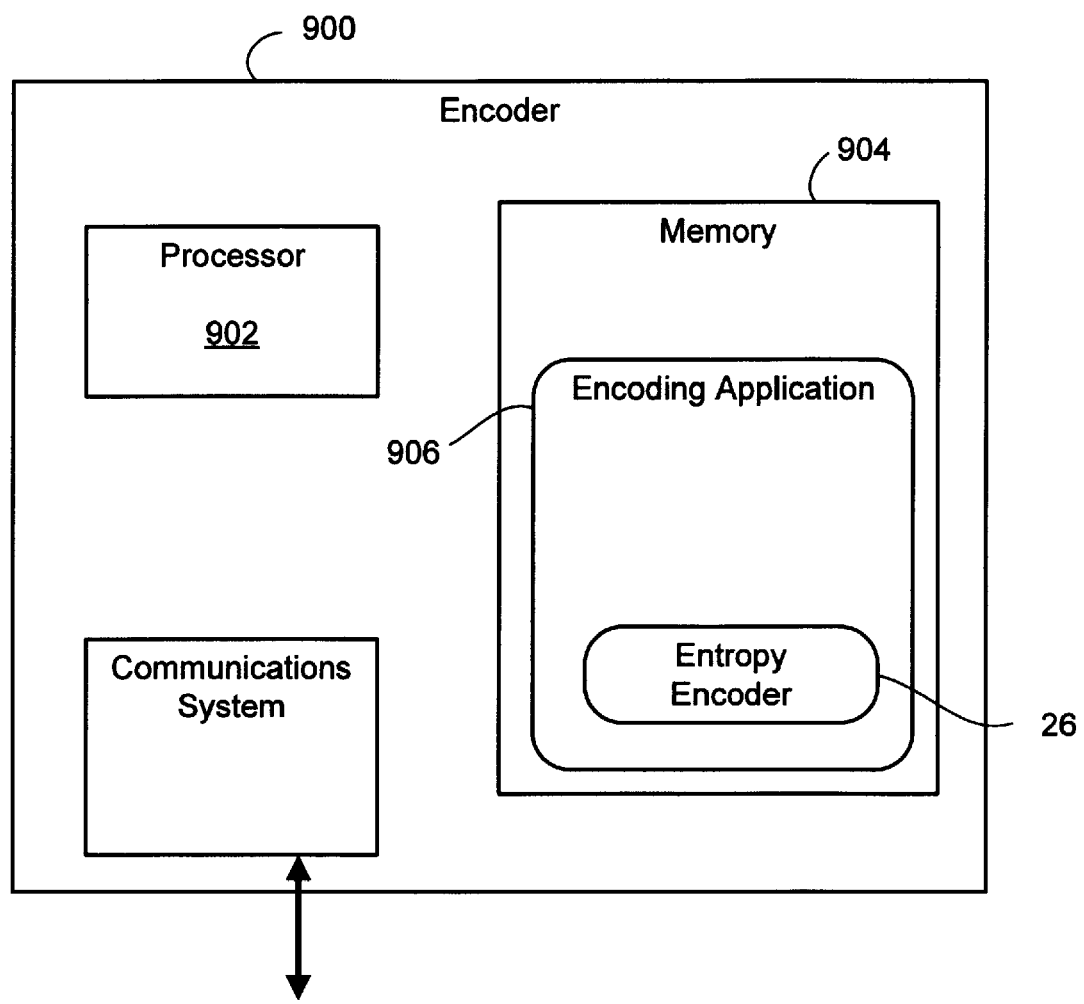
FIG. 7 shows a simplified block diagram of an example embodiment of an encoder.

Reference now made to FIG. 7, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output video bitstreams encoded in accordance with the process described herein. The encoding application 906 may include an entropy encoder 26 configured to entropy encode input sequences and output a bitstream using one or more of the processes described herein. The memory 904 may include the buffer memory and memory elements described herein. As described herein, the codewords may be stored as encoding tables for each of the states k. It will be understood that the encoding application 906 may be stored in on a computer readable medium, such as a compact disc, flash memory device, random access memory, hard drive, etc.

Figure 8:
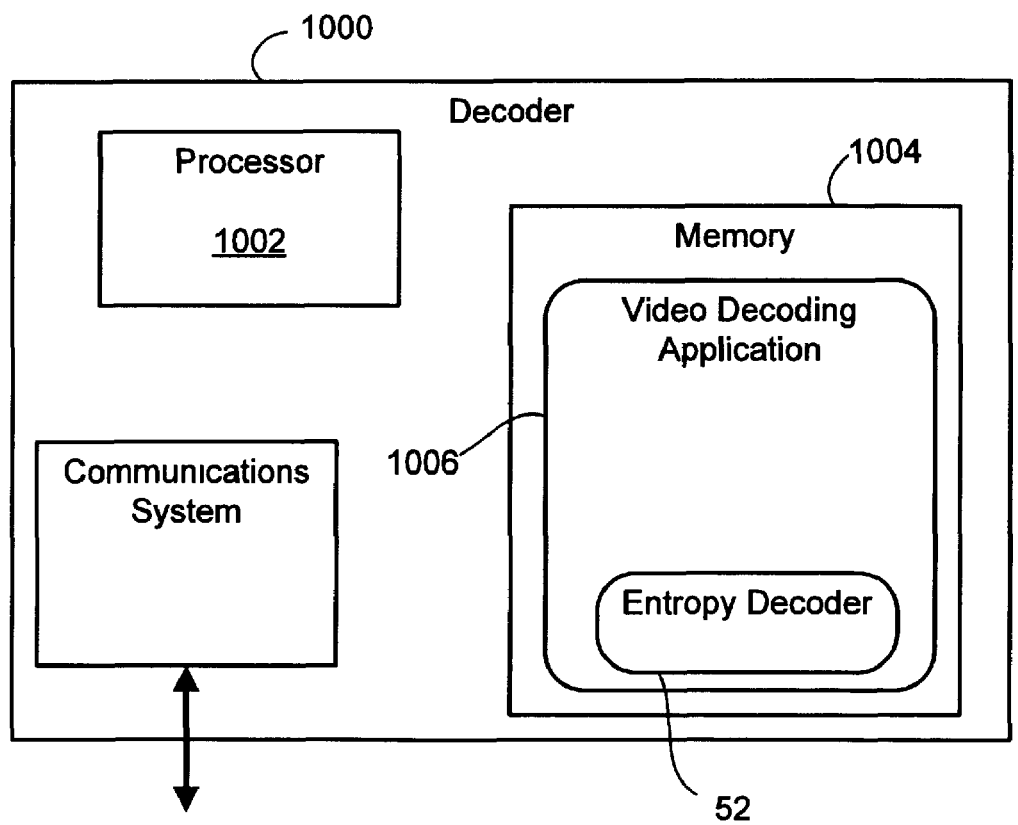
FIG. 8 shows a simplified block diagram of an example embodiment of a decoder.

Reference is now also made to FIG. 8, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 52 configured to receive a bitstream encoded in accordance with one or more of the processes described herein, and to reconstruct a binary sequence from the bitstream of encoded data as described herein. The decoding application 1006 may configure the processor to traverse stored decoding trees/tables to parse codewords from the bitstream and thereby identify corresponding bit sequences. It may also configure the processor 1002 to interleave the symbols of the decode bit sequences to produce a reconstructed binary sequences, as described herein. It will be understood that the decoding application 1006 may be stored in on a computer readable medium, such as a compact disc, flash memory device, random access memory, hard drive, etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated circuit (ASIC), etc.

Certain adaptations and modifications of the described embodiments can be made. Therefore, the above discussed embodiments are considered to be illustrative and not restrictive.

What is claimed is:

1. A method for encoding an input sequence of binary symbols using a context model having a set of context states and a respective $2^L$-ary encoding tree associated with each context state, the method comprising:
for a length-L string of consecutive symbols,
determining the context state for a first symbol of the length-L string, and selecting the $2^L$-ary encoding tree associated with that context state;
appending subsequent length-L strings of consecutive symbols to the length-L string of consecutive symbols to form a sequence of strings and encoding that sequence of strings as a codeword using the selected $2^L$-ary encoding tree; and
updating the context state based on the symbols in that sequence of strings and the context model.

2. The method claimed in claim 1, wherein appending and encoding comprise traversing one level of the selected $2^L$-ary encoding tree based on each L-length string of consecutive symbols in the sequence of strings.

3. The method claimed in claim 2, wherein traversing includes determining that one of the subsequent length-L strings completes the sequence of strings by reaching a leaf node in the selected encoding tree, and wherein encoding includes outputting the codeword corresponding to the leaf node.

4. The method claimed in claim 1, wherein the symbols in the length-L string of consecutive symbols and the symbols in the subsequent length-L string of consecutive symbols all have a common context.

5. The method claimed in claim 1, wherein the updating is performed after each length-L string of consecutive symbols.

6. The method claimed in claim 1, wherein the updating is performed only after encoding the sequence of strings as a codeword.

7. An encoder for encoding an input sequence of symbols, the encoder comprising:
a processor;
a memory; and
an encoding application stored in memory and containing instructions for configuring the processor to encode the input sequence using the method claimed in claim 1.

8. The encoder claimed in claim 7, wherein the processor is configured to append and encode by traversing one level of the selected $2^L$-ary encoding tree based on each L-length string of consecutive symbols in the sequence of strings.

9. The encoder claimed in claim 8, wherein the processor is configured to traverse by determining that one of the subsequent length-L strings completes the sequence of strings by reaching a leaf node in the selected encoding tree, and wherein the processor is configured to encode by outputting the codeword corresponding to the leaf node.

10. The encoder claimed in claim 7, wherein the symbols in the length-L string of consecutive symbols and the symbols in the subsequent length-L string of consecutive symbols all have a common context.

11. The encoder claimed in claim 7, wherein the processor is configured to update the context state after each length-L string of consecutive symbols.

12. The encoder claimed in claim 7, wherein the processor is configured to update the context state after encoding the sequence of strings as a codeword.

13. A method for decoding a bitstream of encoded data to generate a reconstructed binary sequence, the bitstream containing a plurality of codewords, the method comprising:
determining a context associated with a next bit of the reconstructed binary sequence based on a context model; and
determining whether a decoded bit associated with that context is available from a previously decoded codeword and,
if so, adding that decoded bit to the reconstructed binary sequence, and,
if not then
parsing the bitstream to extract a next codeword,
decoding the next codeword using a decoding table selected based upon a context state to obtain a new bit sequence associated with that context, and
adding a first decoded bit from the new bit sequence to the reconstructed binary sequence.

14. The method claimed in claim 13, wherein the decoding comprises matching the next codeword from the bitstream to an entry in the decoding table.

15. The method claimed in claim 13, wherein the determining a context and the determining whether a decoded bit is available are repeated cyclically.

16. A decoder for decoding a bitstream of encoded data to generate a reconstructed binary sequence, the decoder comprising:
- a processor;
- a memory;
- a decoding application stored in memory and containing instructions for configuring the processor to decode the bitstream using the method claimed in claim 13.

17. The decoder claimed in claim 16, wherein the processor is configured to decode by matching the next codeword from the bitstream to an entry in the decoding table.

18. The decoder claimed in claim 16, wherein the processor is configured to determine a context and determine whether a decoded bit is available cyclically.

* * * * *